(12) United States Patent
Therrien et al.

(10) Patent No.: US 7,800,890 B1
(45) Date of Patent: Sep. 21, 2010

(54) METER COVER MOLDING AND METHOD

(75) Inventors: Wayne Alfred Therrien, Rochester, NH (US); Rickey James Deluca, Kennesaw, GA (US); Terry Lee Van Olst, Coal Center, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/614,100

(22) Filed: Nov. 6, 2009

(51) Int. Cl.
*H02B 1/00* (2006.01)

(52) U.S. Cl. ............... 361/659; 324/156; 361/664; 361/666; 361/667

(58) Field of Classification Search ............ 361/659, 361/664, 666, 667
See application file for complete search history.

(56) References Cited

U.S. PATENT DOCUMENTS

| | | | |
|---|---|---|---|
| 2,647,235 A * | 7/1953 | Hogenbirk | 324/105 |
| 2,782,371 A | 2/1957 | Lamb | |
| 3,317,906 A | 5/1967 | Baldridge | |
| 3,836,852 A * | 9/1974 | Ross | 324/123 R |
| 4,686,461 A | 8/1987 | Davis | |
| 4,795,975 A * | 1/1989 | Cox | 324/156 |
| 5,001,420 A * | 3/1991 | Germer et al. | 324/142 |
| 5,027,061 A * | 6/1991 | Palmer et al. | 324/156 |
| 5,049,810 A | 9/1991 | Kirby et al. | |
| 5,057,767 A * | 10/1991 | Keturakis et al. | 324/96 |
| 5,207,595 A | 5/1993 | Learmont et al. | |
| 5,495,238 A | 2/1996 | Baker et al. | |
| 5,571,031 A | 11/1996 | Robinson et al. | |
| 5,577,933 A | 11/1996 | Robinson et al. | |
| 5,861,742 A | 1/1999 | Miller et al. | |
| 5,926,104 A * | 7/1999 | Robinson | 340/825.22 |
| 6,239,588 B1 * | 5/2001 | Tiemann | 324/137 |
| 6,522,124 B1 | 2/2003 | Ballard | |
| 6,737,855 B2 | 5/2004 | Huber et al. | |
| 6,747,446 B1 | 6/2004 | Voisine et al. | |
| 6,773,652 B2 | 8/2004 | Loy et al. | |
| 6,798,191 B1 | 9/2004 | Macfarlane et al. | |
| 7,158,050 B2 | 1/2007 | Lightbody et al. | |
| 7,189,109 B2 * | 3/2007 | Robinson | 439/517 |
| 7,265,532 B2 | 9/2007 | Karanam et al. | |
| 7,298,134 B2 | 11/2007 | Weikel et al. | |
| 7,315,442 B2 | 1/2008 | Robinson | |
| 2002/0135355 A1 | 9/2002 | Acacio | |
| 2003/0025493 A1 | 2/2003 | Fye et al. | |
| 2004/0066609 A1 | 4/2004 | Loy et al. | |
| 2004/0232593 A1 | 11/2004 | Loy et al. | |
| 2005/0122094 A1 | 6/2005 | Robinson | |
| 2008/0036467 A1 * | 2/2008 | Butler | 324/511 |
| 2008/0180885 A1 * | 7/2008 | Loehr et al. | 361/663 |

* cited by examiner

*Primary Examiner*—Gregory D Thompson
(74) *Attorney, Agent, or Firm*—Cantor Colburn LLP

(57) ABSTRACT

A meter cover is provided and includes an opaque portion, including an outer perimeter section to perimetrically fit around a meter, a sidewall extending axially from the perimeter section toward a frontal region and a shield disposed at a portion of a sidewall edge at the frontal region and a transparent portion having an edge, which is shiplap joint bonded with a remaining portion of the sidewall edge and edges of the shield.

20 Claims, 4 Drawing Sheets

METER COVER MOLDING AND METHOD

BACKGROUND OF THE INVENTION

The subject matter disclosed herein relates to a meter cover.

A watt-hour meter typically includes a base housing, electro-mechanical components, electronics and a faceplate capturing all of the device's pertinent information. The assembly is typically incased in what is referred to as a meter cover. The normal expected function of the cover is to protect the internal components of the meter from its service environment, while still allowing visual and communication access to the device while the meter is in service.

In a meter's typical service environment, its internal components are expected to successfully operate within a specified temperature range. Key individual contributing influences would include local ambient temperatures, the metering device's own thermal generation, and heating effects due to solar radiation. The culmination of these three influences will be referred to as the thermal budget. The responsibility of a typical meter's design is stay within its thermal budget considering these three partitioned segments. As the demands for high-powered electronics and communication devices grow in the meter's technology, the metering device's internal thermal generation also grows and, therefore, adjustments to the thermal budget partitioning are necessary. In some cases, adjusting the thermal budget partitioning is possible by mitigating the heating effects due to solar radiation and thereby allowing the metering device's portion of the budget to grow. This is typically achieved through solar radiation shielding.

Typical shielding devices in a watt-hour meter may include, for example, oversized faceplates that shield the internal components, paper-thin polycarbonate sheets that wrap around the periphery of a meter's internal components or opaque covers that include a bonded-on transparent front face. These solutions are, however, relatively costly and difficult to perform.

BRIEF DESCRIPTION OF THE INVENTION

According to one aspect of the invention, a meter cover is provided and includes an opaque portion, including an outer perimeter section to perimetrically fit around a meter, a sidewall extending axially from the perimeter section toward a frontal region and a shield disposed at a portion of a sidewall edge at the frontal region and a transparent portion having an edge, which is shiplap joint bonded with a remaining portion of the sidewall edge and edges of the shield.

According to another aspect of the invention, a meter cover is provided and includes an opaque portion to perimetrically fit around a meter, including a sidewall extending axially from a perimeter toward a frontal region and a shield disposed at a portion of a sidewall edge and a transparent portion, including a first part disposed in parallel with the shield and a second part disposed transverse to the first part and in parallel with the sidewall, the transparent portion having an edge bonded with a remaining portion of the sidewall edge and edges of the shield.

According to another aspect of the invention, a two-color in molding method to form a meter cover is provided and includes molding an opaque portion to include an outer perimeter section, a sidewall extending axially from the perimeter section toward a frontal region and a shield disposed at a portion of a sidewall edge and molding a transparent portion to have an edge, which is shiplap joint bonded with a remaining portion of the sidewall edge and edges of the shield.

These and other advantages and features will become more apparent from the following description taken in conjunction with the drawings.

BRIEF DESCRIPTION OF THE DRAWING

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
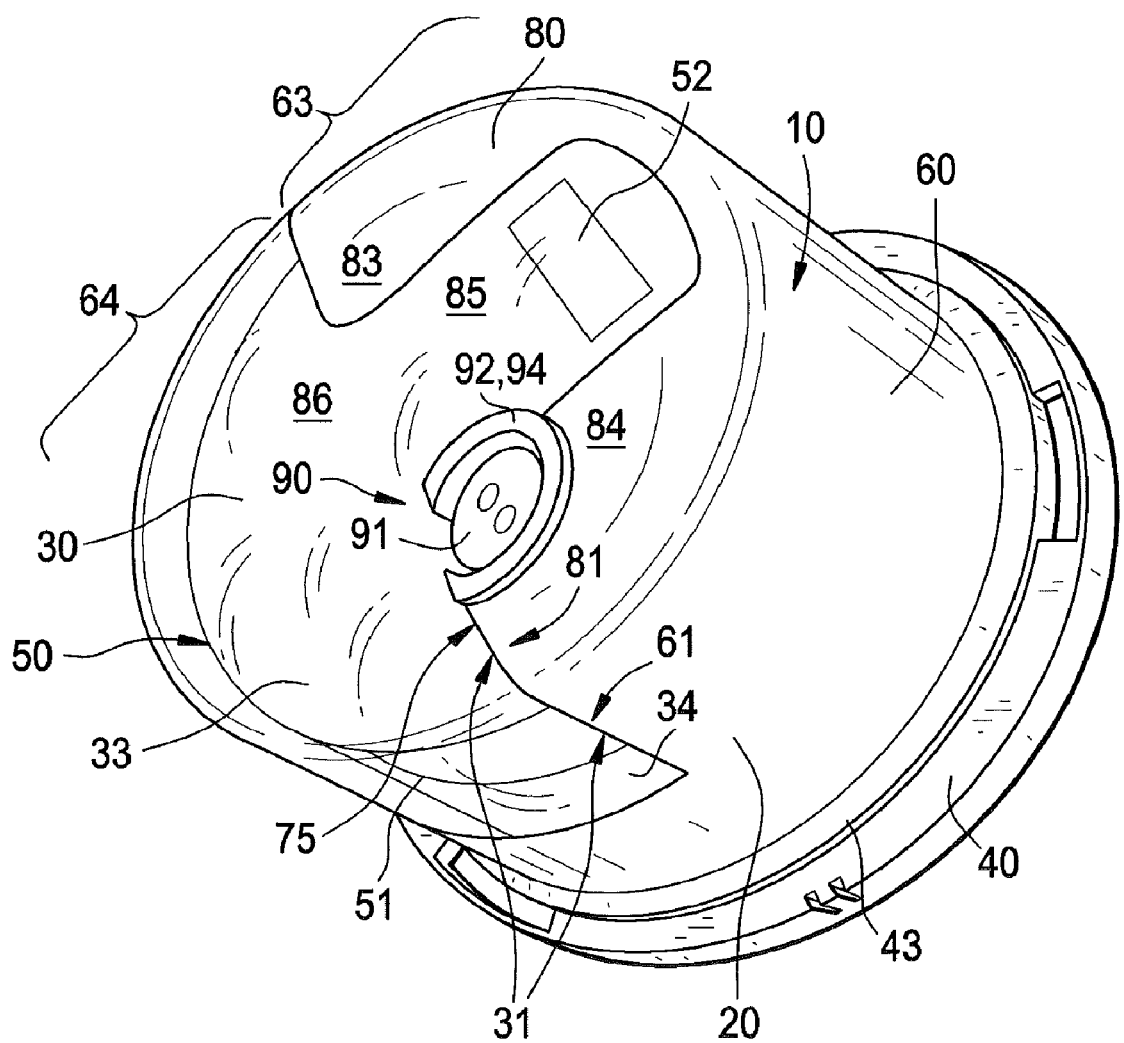
FIG. 1 is a perspective view of a meter cover.
Figure 2:
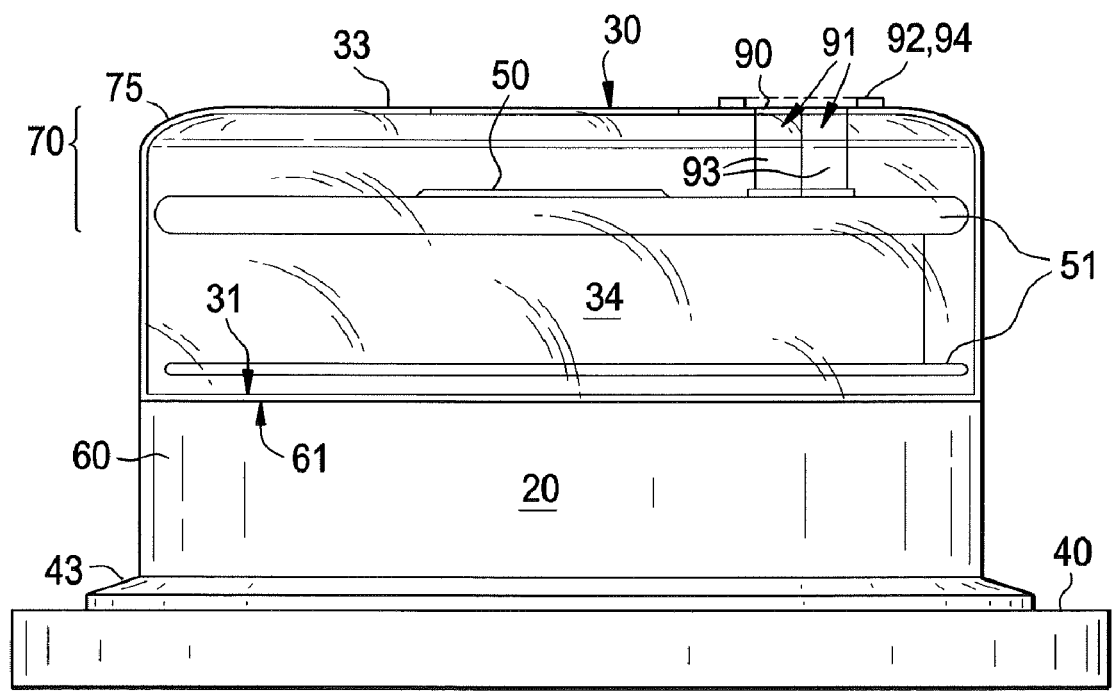
FIG. 2 is a side sectional view of the meter cover of FIG. 1.

With reference to FIGS. 1 and 2 and, in accordance with aspects of the invention, a meter cover 10 is provided. The meter cover 10 encompasses all of the advantages of independent solar shields and ambient light shields of typical meter covers and can be formed as one integral low cost component. As will be described below, the meter cover 10 is formed in a two-color in molding process that provides a unique balance between opaque and transparent portions of the cover and further provides protection from ambient light and reduces the internal heating effects of solar heating. The meter 10 thereby eliminates the need for additional shielding components or additional assembly processes.

The meter cover 10 includes an opaque portion 20 and a transparent portion 30. The opaque portion 20 includes an outer perimeter section 40, which is sufficiently sized and shaped to perimetrically fit around an exemplary utility meter 50. A sidewall 60 extends axially from the perimeter section 40 toward a frontal region 70. A shield 80 is disposed at a portion of a sidewall edge 61 at the frontal region 70. The transparent portion 30 includes a first part 33 that is disposed in parallel with the shield 80 and a second part 34 that is disposed transverse to the first part 33 and in parallel with the sidewall 60. The transparent portion 30 has an edge 31, which is shiplap joint bonded with a remaining portion of the sidewall edge 61 and exposed edges 81 of the shield 80.

The shape of the transparent portion 30 extends down into the sidewall 60 for visual reasons and acts as a fundamentally more robust design with respect to impact characteristics. For example, a frontal impact to the meter cover 10 will result in compressive loads being applied to the lower hemisphere region (the second hemisphere 64 described below) and shear loads being applied at the upper hemisphere region (the first hemisphere 63 described below). This construction is unique as compared to other meter covers that have a clear front face only and experience joint damage from impacts due to high shear loads at their joints.

Figure 3:
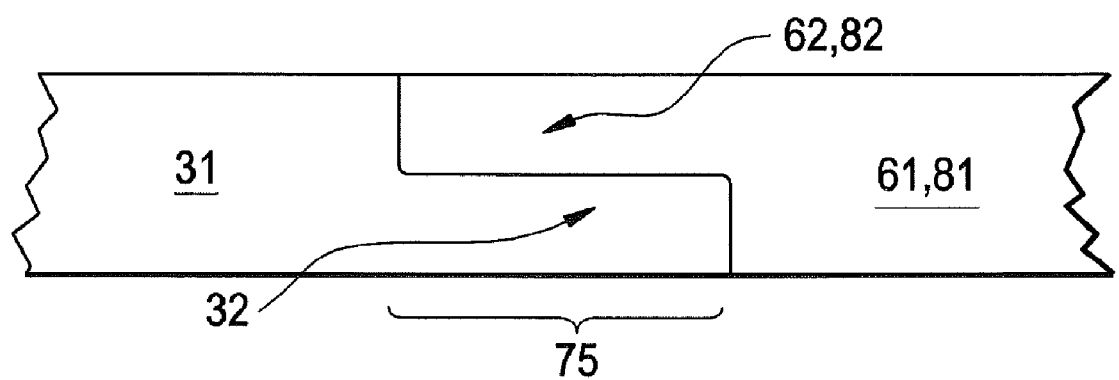
FIG. 3 is an enlarged view of a shiplap joint bond of the meter cover of FIG. 1.

With reference to FIG. 3, the shiplap joint bond 75 is achieved between the edge 31 of the transparent portion 30 and the sidewall edge 61 as well as the exposed edges 81 of the shield 80. The edge 31 includes a flap 32 that overlaps with or is overlapped by complementary flaps 62 and 82 of the sidewall edge 61 and the exposed edges 81. Bonding between the flaps 32, 62 and 82 occurs at the molecular level, as will be described below, and requires no additional adhesive or structural fastening features although it is understood that adhesives and/or structural fastening features could be employed for further support. As shown, corners of the flaps 32, 62 and 82 may also be rounded for improved material flow considerations.

With reference back to FIGS. 1 and 2, the perimeter section 40 may include a flange 43. The flange 43 is connectable with an external surface of the meter 50 and/or a support structure on which the meter 50 is mounted. The sidewall 60 extends axially from an interior region of the flange 43 toward the frontal region 70.

The sidewall 60 may include a first hemisphere 63 and a second hemisphere 64. The first hemisphere 63 extends axially toward and reaches the frontal region 70. The second hemisphere 64 also extends axially toward the frontal region 70 but is axially shorter than the first hemisphere 63. In some embodiments, the second hemisphere 64 is sufficiently axially short to thereby expose interior components 51 of the meter 50 to observation from an exterior observer.

The shield 80 is oriented in a plane that is transverse to a plane of the sidewall 60. In this way, the shield 80 may be oriented in parallel with a front face of the meter 50. The shield 80 may also be plural in number with at least first and second shield portions 83, 84 disposed on opposite sides of the meter cover 10 to define an aperture 85 between them and a relatively large opening 86 adjacent to the aperture 85. The aperture 85 and the opening 86 may be positioned to expose a display unit 52 and identification information of the meter 50 and are substantially spaced from shield requiring components of the meter 50. The shield portions 83, 84 provide increased shielding for the meter cover 10 as well as increased shade from ambient light and, in some embodiments, are positioned proximate to a shield requiring component of the meter 50.

Figure 4:
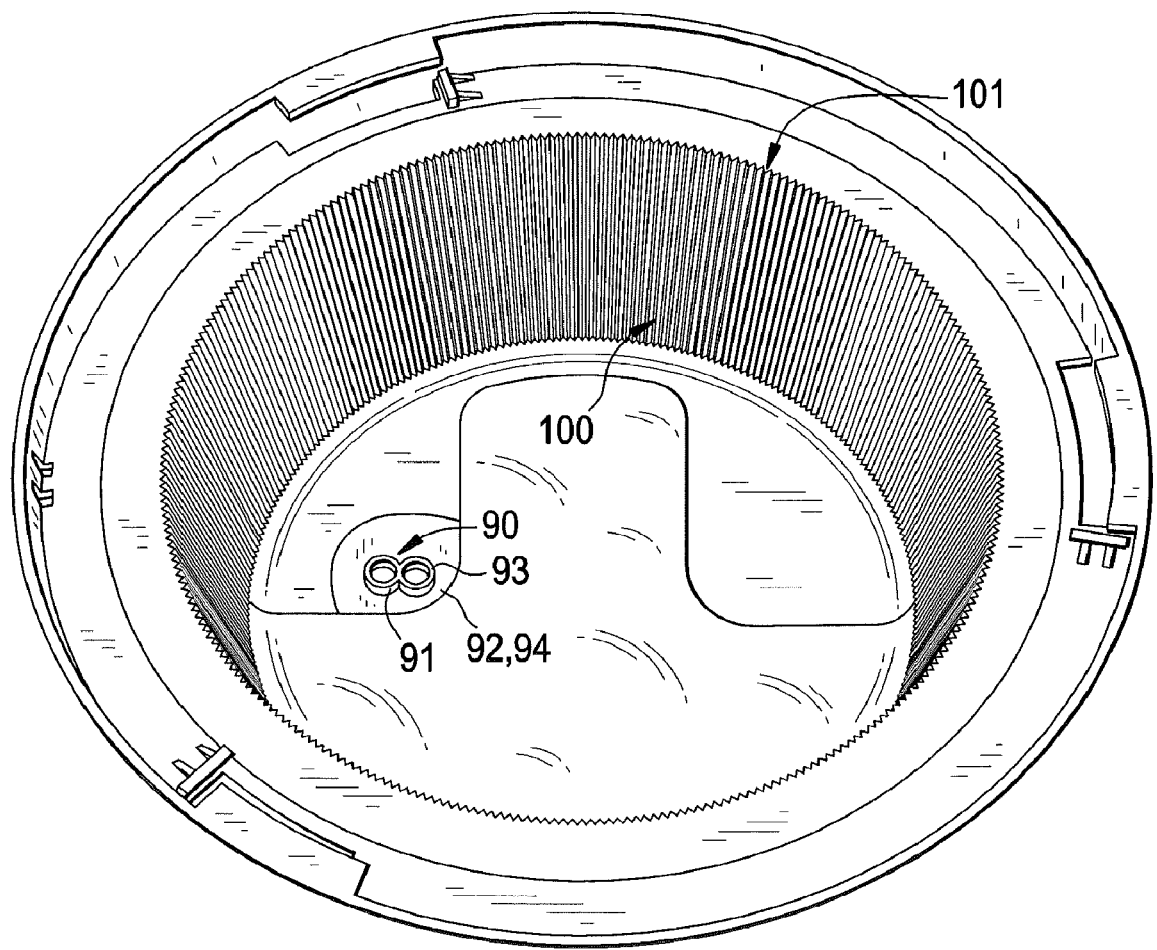
FIG. 4 is a perspective view of an interior of the meter cover of FIG. 1.

With reference to FIGS. 1, 2 and 4, the opaque portion 20 and the transparent portion 30 may be further formed to cooperatively define a communication port 90 through which a light emitting diode (LED) or a set of LEDs disposed on the meter 50 can be exposed for connection to an external tool. In these embodiments, the opaque portion 20 is formed to define one or more through-holes 91 exposing each LED disposed on the meter 50. The transparent portion 30 is formed to define a raised boss 92 proximate to the through-hole(s) 91 and tubing 93 extending through the through-hole(s) 91 toward the LED. As shown, the raised boss 92 may have a horse-shoe shape and be positioned to bracket the through-hole(s) 91 although this is merely exemplary and it is understood that the shape of the raised boss 92 need only resemble the shape of the external tool and its distance from the through-hole(s) 91 be set in accordance with a size of the external tool. Thus, the horseshoe shape of the raised boss 92 provides axial alignment and radial orientation for the external tool.

In further embodiments, a magnetic material 94 is disposed on or in the raised boss 92 of the communication port 90. The magnetic material 94 complements magnetic material of the external tool and facilitates connection and alignment between the external tool and the LEDs disposed on the meter 50.

With reference to FIG. 4, at least one of the opaque portion 20 and the transparent portion 30 may include an interior surface 100 with ribs 101 formed thereon. The ribs 101 can be provided in various configurations and may be formed in various shapes to reduce material volume and/or increase surface area. With the ribs 101, a material strength and heat dissipating characteristics of the opaque portion 20 and the transparent portion 30 can be increased. The ribs 101 may also provide a translucent effect when and if the opaque portion is substituted with a clear material.

While the opaque portion 20 and the transparent portion 30 may each be formed in various shapes and sizes, the opaque portion 20 may be further formed with at least one of ambient light blocking and light filtering materials. The opaque portion 20 may be relatively lightly colored and/or polished and, in addition, may offer UV protection of the interior components 51 of the meter 50. Both the opaque portion 20 and the transparent portion 30 may be formed of materials which are similar or different but which are combinable for performance and cost effectiveness.

In accordance with another aspect, a two-color in molding method to form a meter cover 10 is provided. The method includes molding the opaque portion 20 and the transparent portion 30 to include the features discussed above and, in some cases, to include the communication port 90 having the through-hole 91, the raised boss 92, the tubing 93 and the magnetic material 94. The method may further include forming ribbing on an interior surface of at least one of the opaque portion 20 and the transparent portion 30 and at least one of relatively lightly coloring and polishing a surface of the opaque portion.

According to a further aspect, a two-color in molding method to form a meter cover 50 is provided and includes molding an opaque portion 20 to include the features discussed above, waiting for a predefined period of time during which a material of the opaque portion 20 partially hardens and molding a transparent portion 30 to include the features discussed above.

The predefined period of time is sufficiently long to allow the material of the opaque portion 20 to partially harden and still become molten in contact with molten material of the transparent portion 30 during the molding of the transparent portion 30. The predefined period of time is not so long, however, that the material of the opaque portion 20 completely hardens such that it fails to become sufficiently molten during the molding of the transparent portion 30. As the molten material of both the opaque portion 20 and the transparent portion 30 harden together, molecular level bonding occurs at and around the shiplap joint of the flaps 32, 62 and 82.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A meter cover, comprising:
    an opaque portion, including an outer perimeter section to perimetrically fit around a meter, a sidewall extending axially from the perimeter section toward a frontal region and a shield disposed at a portion of a sidewall edge at the frontal region; and a transparent portion having an edge, which is shiplap joint bonded with a remaining portion of the sidewall edge and edges of the shield.

2. The meter cover according to claim 1, wherein the sidewall comprises first and second hemispheres, the first hemisphere reaching the frontal region and the second hemisphere being axially shorter than the first hemisphere.

3. The meter cover according to claim 2, wherein the second hemisphere has an axial dimension to expose interior components of the meter.

4. The meter cover according to claim 1, wherein the shield is oriented transverse to the sidewall.

5. The meter cover according to claim 1, wherein at least one of the opaque and transparent portions comprises a ribbed interior surface.

6. The meter cover according to claim 1, wherein the opaque and transparent portions are formed to define a communication port.

7. The meter cover according to claim 6, wherein the opaque portion is formed to define a through-hole exposing an LED disposed on the meter, and the transparent portion is formed to define a raised boss and tubing extending through the through-hole toward the LED.

8. The meter cover according to claim 7, further comprising a magnetic material disposed on the raised boss.

9. The meter cover according to claim 1, wherein the opaque portion comprises at least one of ambient light blocking and light filtering materials.

10. The meter cover according to claim 1, wherein the opaque portion is at least one of relatively lightly colored, polished and UV protecting.

11. The meter cover according to claim 1, wherein the transparent portion edge is at least one of frontally overlapping of and frontally overlapped by the remaining portion of the sidewall edge and the edges of the shield.

12. The meter cover according to claim 1, wherein the transparent portion edge is shiplap joint bonded with the remaining portion of the sidewall edge and the edges of the shield at a molecular level.

13. A meter cover, comprising:

an opaque portion to perimetrically fit around a meter, including a sidewall extending axially from a perimeter toward a frontal region and a shield disposed at a portion of a sidewall edge; and a transparent portion, including a first part disposed in parallel with the shield and a second part disposed transverse to the first part and in parallel with the sidewall, the transparent portion having an edge bonded with a remaining portion of the sidewall edge and edges of the shield.

14. The meter cover according to claim 13, wherein the sidewall comprises first and second hemispheres, the first hemisphere reaching the frontal region and the second hemisphere being axially shorter than the first hemisphere, wherein the second hemisphere has an axial dimension to expose interior components of the meter.

15. The meter cover according to claim 14, wherein the second part of the transparent portion is adjacent to and disposed in parallel with the second hemisphere.

16. A two-color in molding method to form a meter cover, the method comprising:

molding an opaque portion to include an outer perimeter section, a sidewall extending axially from the perimeter section toward a frontal region and a shield disposed at a portion of a sidewall edge; and molding a transparent portion to have an edge, which is shiplap joint bonded with a remaining portion of the sidewall edge and edges of the shield.

17. The two-color in molding method according to claim 16, wherein the molding of the transparent portion comprises molding first and second transverse parts of the transparent portion to be parallel with the shield and the sidewall, respectively.

18. The two-color in molding method according to claim 16, further comprising forming a communication port.

19. The two-color in molding method according to claim 18, further comprising disposing magnetic material in the communication port.

20. The two-color in molding method according to claim 16, further comprising forming ribbing.

* * * * *